(12) United States Patent
Rich

(10) Patent No.: US 6,949,170 B2
(45) Date of Patent: Sep. 27, 2005

(54) DEPOSITION METHODS AND APPARATUS

(75) Inventor: Paul Rich, Gloucestershire (GB)

(73) Assignee: Trikon Holdings Limited, Newport (GB)

(*) Notice: Subject to any disclaimer, the term of this patent is extended or adjusted under 35 U.S.C. 154(b) by 160 days.

(21) Appl. No.: 10/464,468

(22) Filed: Jun. 19, 2003

(65) Prior Publication Data

US 2004/0003771 A1 Jan. 8, 2004

Related U.S. Application Data

(60) Provisional application No. 60/407,237, filed on Sep. 3, 2002.

(30) Foreign Application Priority Data

Jul. 6, 2002 (GB) .............................. 0215699

(51) Int. Cl.[7] .......................... C23C 14/34; C23C 8/00; C23C 16/00; C23F 1/00
(52) U.S. Cl. .............................. 204/192.12; 204/298.2; 204/298.23; 204/298.28; 427/585; 216/58; 118/730; 156/345.55
(58) Field of Search ...................... 204/192.12, 298.23, 204/298.28, 298.2, 298.22; 427/585; 216/58; 118/730; 156/345.55

(56) References Cited

U.S. PATENT DOCUMENTS

| 3,858,547 | A |  | 1/1975 | Bergfelt | 118/49 |
| 4,002,141 | A | * | 1/1977 | Shrader | 118/730 |
| 4,108,107 | A |  | 8/1978 | Scheuermann | 118/49.1 |
| 4,756,815 | A |  | 7/1988 | Turner et al. | 204/298 |
| 2001/0053043 | A1 | * | 12/2001 | Kanazawa et al. | 360/110 |
| 2005/0003196 | A1 | * | 1/2005 | Smith | 428/409 |

FOREIGN PATENT DOCUMENTS

| DE | 39 34 887 A1 |  | 4/1990 | G11B/13/04 |
| JP | 2002-20864 | * | 1/2002 | C23C/14/34 |

* cited by examiner

Primary Examiner—Steven VerSteeg
(74) Attorney, Agent, or Firm—Volentine Francos & Whitt, PLLC

(57) ABSTRACT

A method and apparatus for processing a thin film on a substrate. The method involves locating the substrate in a first rotational position a location opposed to a process station. The process station has a first axis and is arranged for processing the substrate about that axis. The substrate location is symmetrical about a second axis parallel to but offset from the first axis. The substrate is rotated about an axis generally orthogonal and passing through the wafer location to a second rotational position after an initial process and further processing takes place when the substrate is in the second rotational position.

19 Claims, 6 Drawing Sheets

DEPOSITION METHODS AND APPARATUS

The present application claims the benefit of U.S. provisional patent application Ser. No. 60/407,237 filed on 3rd Sep. 2002.

FIELD OF THE INVENTION

This invention relates to a method and apparatus for depositing a thin film on a substrate.

BACKGROUND TO THE INVENTION

In the creation of many electronic devices, such as semiconductor chips, and micro-mechanical devices films are deposited by physical vapour or chemical vapour deposition techniques and formation may be etched. Particularly where multiple devices are being formed on a single substrate, as, for example, happens when semiconductor chips are made from a single wafer, the uniformity of that deposition can become crucial if the rejection rate is not to reach uneconomic proportions. Although many designs and techniques have been developed to improve uniformity of deposition and etching, almost all techniques have a lack of uniformity, particularly between the centre of the substrate and the edge. This lack of uniformity has become more significant as wafer sizes have increased.

SUMMARY OF THE INVENTION

From one aspect the invention consists in a method for processing a substrate including locating the substrate in the first rotational position at a location opposed to a process station, the process station having a first axis and being arranged for processing the substrate about that axis characterised in that the substrate location is symmetrical about a second axis parallel to but offset from the first axis and in that the substrate is rotated about the second axis to a second rotational position after an initial process and further processing takes place when the substrate is in the second rotational position.

Preferably the substrate is rotated more than once and there are a plurality of deposition periods. Thus, for example, the substrate may take up successively positions which are 90°, 180° and 270° offset from the first rotational position.

The process may be continuous, in which case the further process or plurality of process periods would be defined by the rotation of the substrate. It is however preferred to interrupt the process during the rotation of the substrate.

The offset between the axes is preferably less than the width of the substrate, more preferably less than half the width (e.g. the radius of a circular substrate such as a wafer). For example the offset between the axes may be between 5 and 40 mm for a semiconductor wafer of at least 100 mm.

What the applicants have found is that by rotating the substrate at stages in the process, a significant improvement of uniformity can be achieved. For example the one sigma uniformity may be less than 0.5%.

As has been indicated above the process may be any suitable process, but the method is particularly efficacious in relation to sputtering. In that case the deposition station may include a target, a magnetron rotatable relative to the target about the first axis and the target may have an axis for symmetry which is coincident with or offset from that first axis.

From another aspect the invention consists in substrate process apparatus including process station having a first axis, for processing a substrate a substrate support for supporting a substrate about a second axis characterised in that the first and second axes are offset and the apparatus further includes a substrate turntable device for rotating the substrate about an axis that passes generally orthogonal through the substrate location to a position that is less than 360° from its starting position.

When the process is sputtering the process station may include a target and a magnetron rotatable about the first axis.

The apparatus may further include a controller for operating the apparatus in the sequence:
1. sputter material onto the substrate to part of the intended depth;
2. rotate the substrate to the position and
3. sputter some or all of the remaining intended depth.

The controller may control step 3 to deposit some of the intended depth, in which case steps 2 and 3 would be repeated.

The turntable device may comprise a boss centrally located in the support and raisable from the support for rotation. The turntable device may be driven by at least one magnetically coupled actuator. Preferably there would be a magnetically coupled actuator for rotation and another for lift and these would be located outside the process chamber.

From a further aspect the invention includes a method of treating a substrate in apparatus for processing the substrate wherein the processing at the substrate is non uniform characterised in that the wafer is rotated about an axis that passes generally orthogonal through the wafer location during processing or between processing steps to enhance conformity of process. The axis of rotation is situated between the center of the wafer and its edge (and not including its center).

Although the invention has been defined above, it is to be understood that it includes any inventive combination of the features set out above, or in the following description.

BRIEF DESCRIPTION OF THE DRAWINGS

The invention may be performed in various ways and a specific embodiment will now be described, by way of example, with reference to the accompanying drawings in which.

DETAILED DESCRIPTION OF THE DRAWINGS

Figure 1:
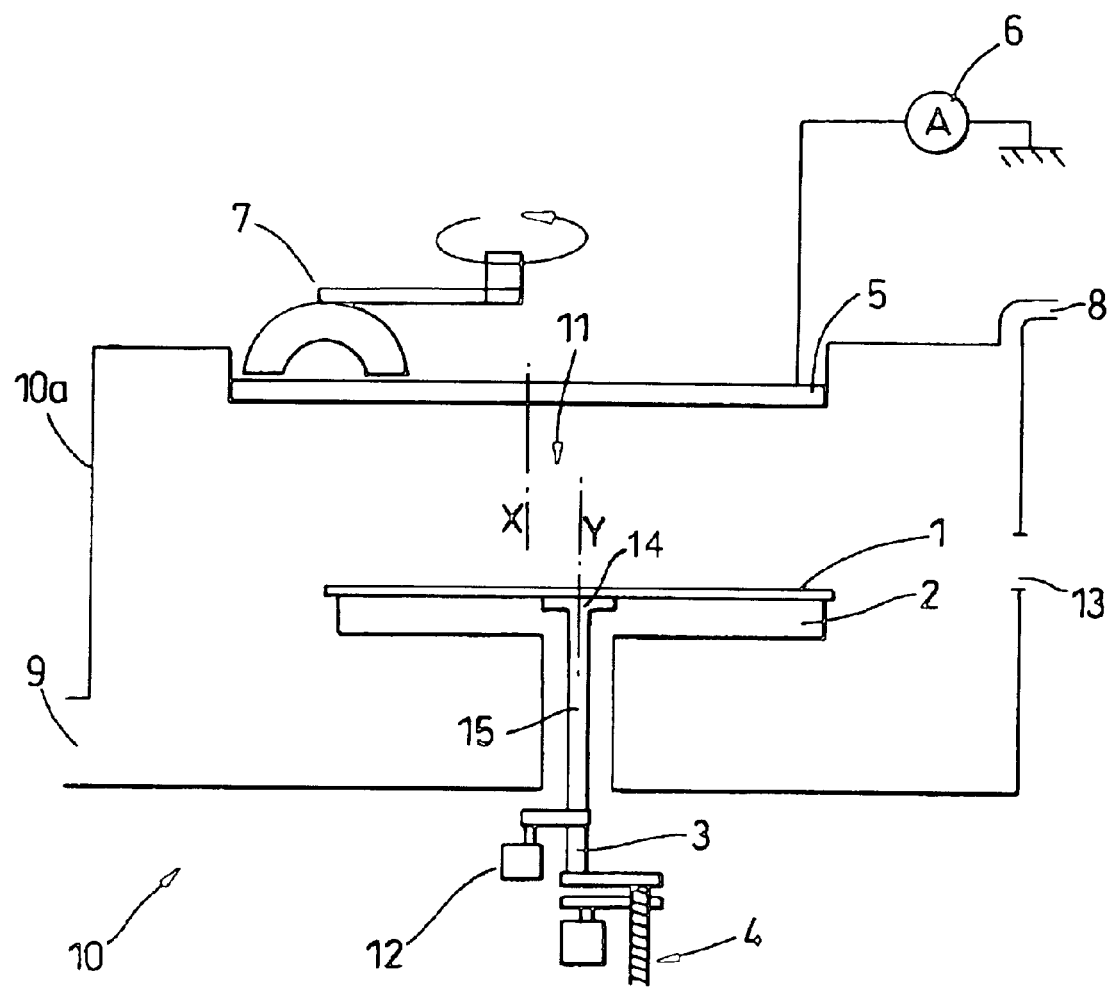
FIG. 1 is a schematic view of a sputtering apparatus.

The experiments which are described below were carried out using a standard single wafer vacuum sputtering apparatus, in which a wafer and a target and magnetron assembly are normally disposed about a common axis. For the experiment the wafers were placed off axis with respect to the platen assembly, removed and then part rotated and returned, but for non-experimental purposes it is envisaged that the apparatus illustrated in FIG. 1 would be used, which achieves the same end result, but on a more efficient basis.

Thus a vacuum sputtering chamber is generally indicated at 10 and includes a chamber 10a which supports a target 5 above a substrate support or platen 2 and defines a transport opening 13, a process gas port 8 and a pumping port 9. A magnetron 7 is associated with the target 5 and the target 5 is driven from a power supply 6. Located within the support 2 is a substrate lifting mechanism 3 that includes a central boss 14, a shaft 15, a rotating mechanism 12 and a lift mechanism 4, which comprises a stepper motor and lead screw arrangement. This enables the central boss 14 to be lifted and rotated and thereby lift and rotate the substrate 1 mounted on the support 2.

The magnetron 7 is mounted for rotation about an axis X, whilst the substrate is centred and rotated about an axis Y. The axes X and Y are accordingly displaced at 11 by an offset which can be any suitable value greater than 0 mm and less than the radius of the wafer. The offset that was used experimentally was 18 mm.

Although the magnetron 7 is illustrated as being coaxial with the target 5, this need not necessarily be the case. Additionally or alternatively the magnetron axis could be shifted from the axis of the target by a linear translation of the magnetron with respect to the target. In general this is less preferred as any portion of the target not sputtered is a potential site for poor quality deposition and may disengage from the target surface and form a particle. This would then require a cleaning step with the substrate shielded or not present.

Figure 6:
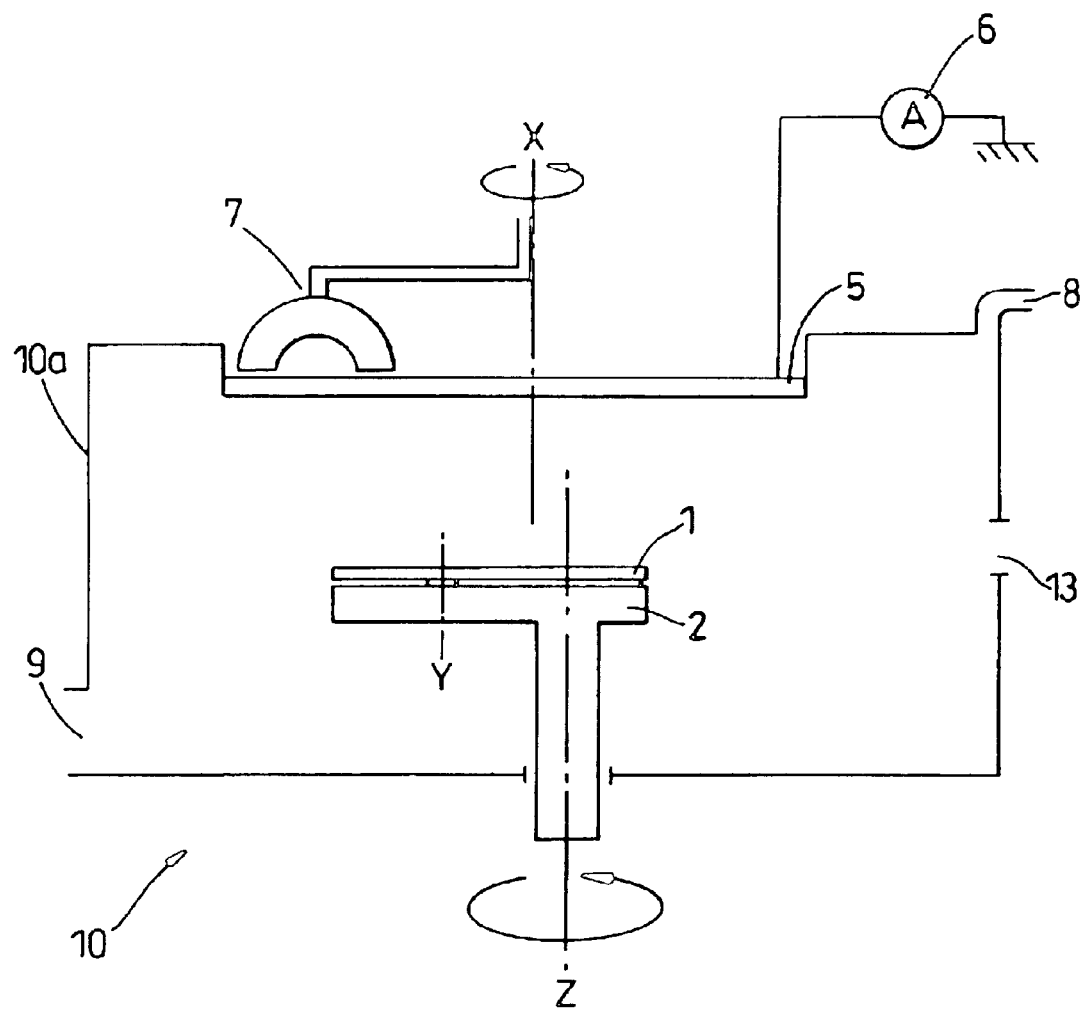
FIG. 6 is a schematic view of an alternative apparatus.

In FIG. 6 is shown an alternative arrangement within the scope of the invention. The parts of the apparatus are numbered as in FIG. 1 and FIG. 6 illustrate an apparatus where a wafer is rotated about an axis Z that passes generally orthogonal through the wafer location, between the wafer center, Y and its edge. Irrespective of whether the axis of rotation of the wafer Z and the axis of the magnetron X coincide, the axis of the wafer is offset from that of the magnetron introducing a non-uniformity of process that can in effect be scanned across the wafer by the rotation of the wafer. Surprisingly this may lead to better uniformity of process than when the wafer axis Y and magnetron axis X coincide, as is the present case in single wafer sputtering systems.

Thus it will be seen that in total contrast to the historical approach where every effort was made to make the deposition apparatus and chamber as symmetrical with the substrate as was possible, the applicants are deliberately introducing a non-uniformity and then utilising that non-uniformity to achieve substantially uniform deposition by rotating the substrate within that chamber.

Alternatively they can utilise inherent non-uniformity within a nominally uniform chamber particularly if that would normally result in asymmetric processing of a substrate. Such non-uniformities might arise from, for example, the location of the gas inlet 8, pumping part 9 or wafer transport door 13.

In the experiments carried out by the applicants titanium was deposited as a thin film barrier on sub-micron recesses as part of an interconnect layer upon the silicon wafer which had been deposited in a metal deposition chamber. Table 1, below, outlines the process conditions used. As has been mentioned before the system was an otherwise conventional DC magnetron sputtering system with a rotating magnetron behind the static sputter target.

TABLE 1 process conditions

| | Deposition Parameter |
|---|---|
| Gas type | Ar |
| Pressure (mT) | 3 approximately |
| Gas flow sccm | 100 |
| Process time(s) | 60 |
| Process temperature ° C. | 120 |

The process time was about 60 seconds to ensure that undesirable effects, such as those due to magnetron plasma striking or with the magnetron beginning rotation, were minimised.

The wafer positions are set out in Table 2 below. A modified platen was fitted so that the wafer (150 mm in diameter) could be positioned offset from the axis of the magnetron and the wafer position was varied such that it was moved from the central position by up to 84 mm. As the wafer was moved to an outer position, as can be seen from Table 2, the uniformity deteriorates since the deposition at the far edge from the target becomes increasingly thin. This uniformity was measured on an industry standard tester and is quoted using the industry standard term, one sigma uniformity, which means one standard deviation, as a percentage, where higher numbers indicate reduced uniformity and zero is perfect uniformity.

TABLE 2

The wafer positions in the chamber

| Wafer offset with respect to magnetron centre (695 mm) | Sheet resistance (Ω/sq) | Standard deviation (%) |
|---|---|---|
| 0 mm | 4.64 | 0.85 |
| 7 mm | 4.56 | 0.99 |
| 18 mm | 5.01 | 2.27 |
| 37 mm | 4.69 | 2.82 |
| 50 mm | 4.75 | 6.68 |
| 67 mm | 5.09 | 13.82 |
| 84 mm | 5.5 | 25.87 |

As has been mentioned Table 2 shows, as one might expect, that moving the wafer off centre to a position that gives a non radial pattern (e.g. 84 mm offset) causes a deterioration in the uniformity of deposition. However, the applicants have discovered that by performing one deposition step and then rotating the wafer to a position which is less than 360° from the starting position and performing another deposition step improves the deposition uniformity even as compared with the deposition that is achieved with the wafer on axis and with no rotation.

This is shown in Table 3, below, in which a wafer was offset by 18 mm and then rotated in accordance with various protocols, as set out in the table.

TABLE 3

| Wafer offset with respect to magnetron centre | Standard Deviation (%) 0° rotation | Standard Deviation (%) 0° + 180° rotation | Standard Deviation (%) 0° + 90° + 180° + 270° |
|---|---|---|---|
| 18 mm offset | 2.27% | 0.28% | 0.28% |

Figure 2:
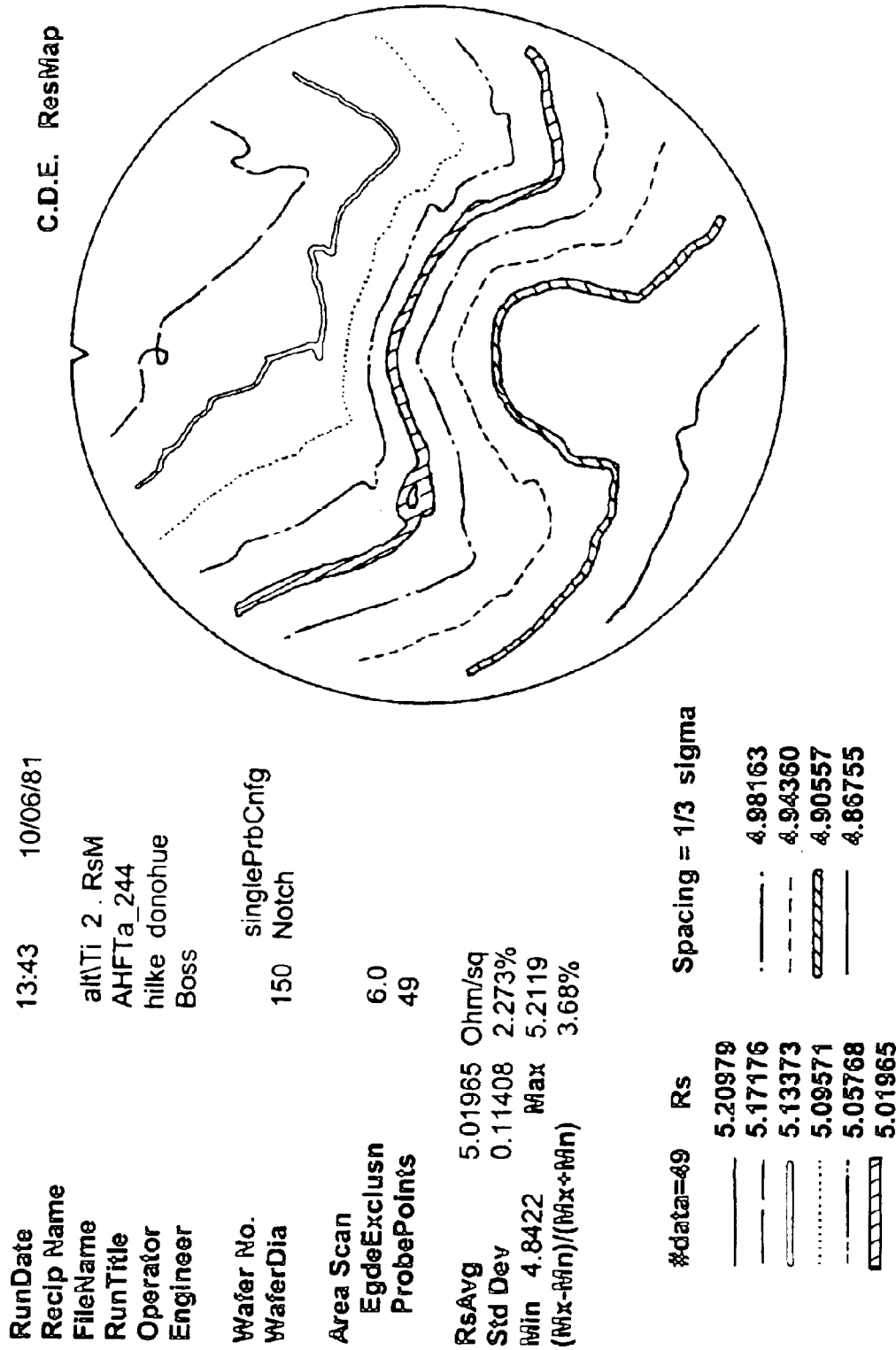
FIG. 2 is a resistivity profile map for a wafer which has been processed with an axis offset of 18 mm in a first position.
Figure 3:
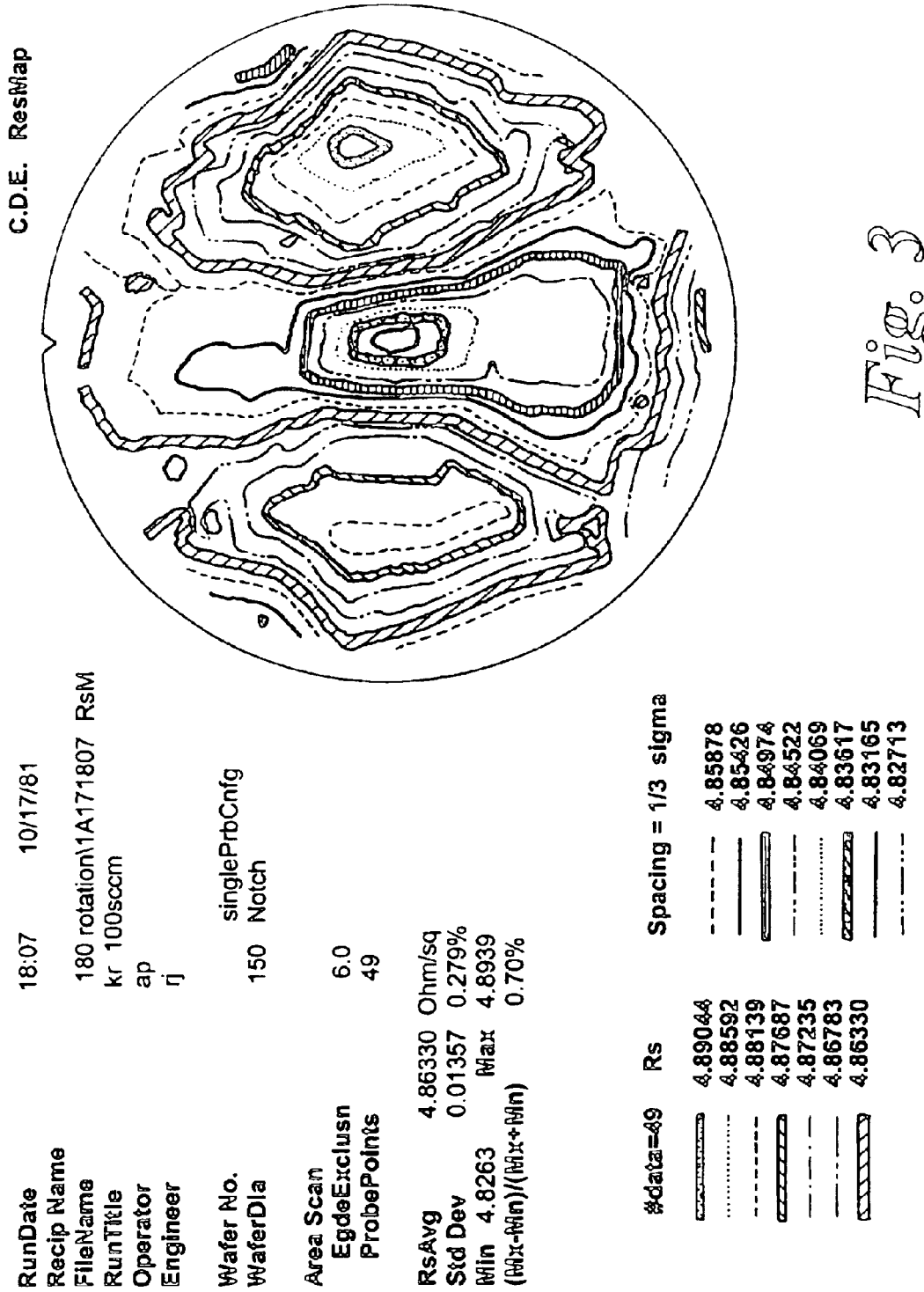
FIG. 3 is the corresponding map for a wafer which has then subsequently been rotated through 180° and processed.
Figure 4:
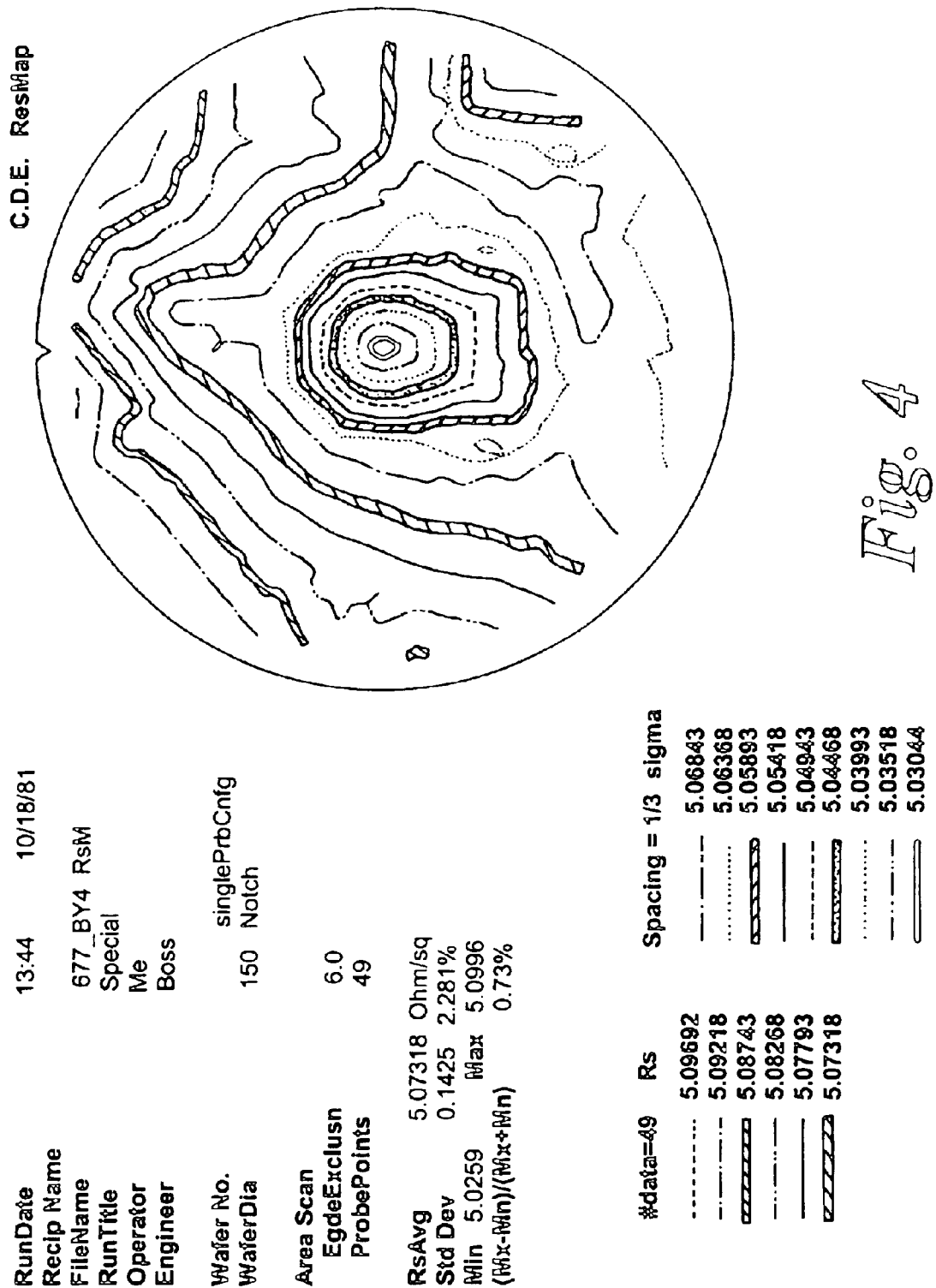
FIG. 4 is the corresponding map for a wafer that has been rotated four times by 90° on each occasion.
Figure 5:
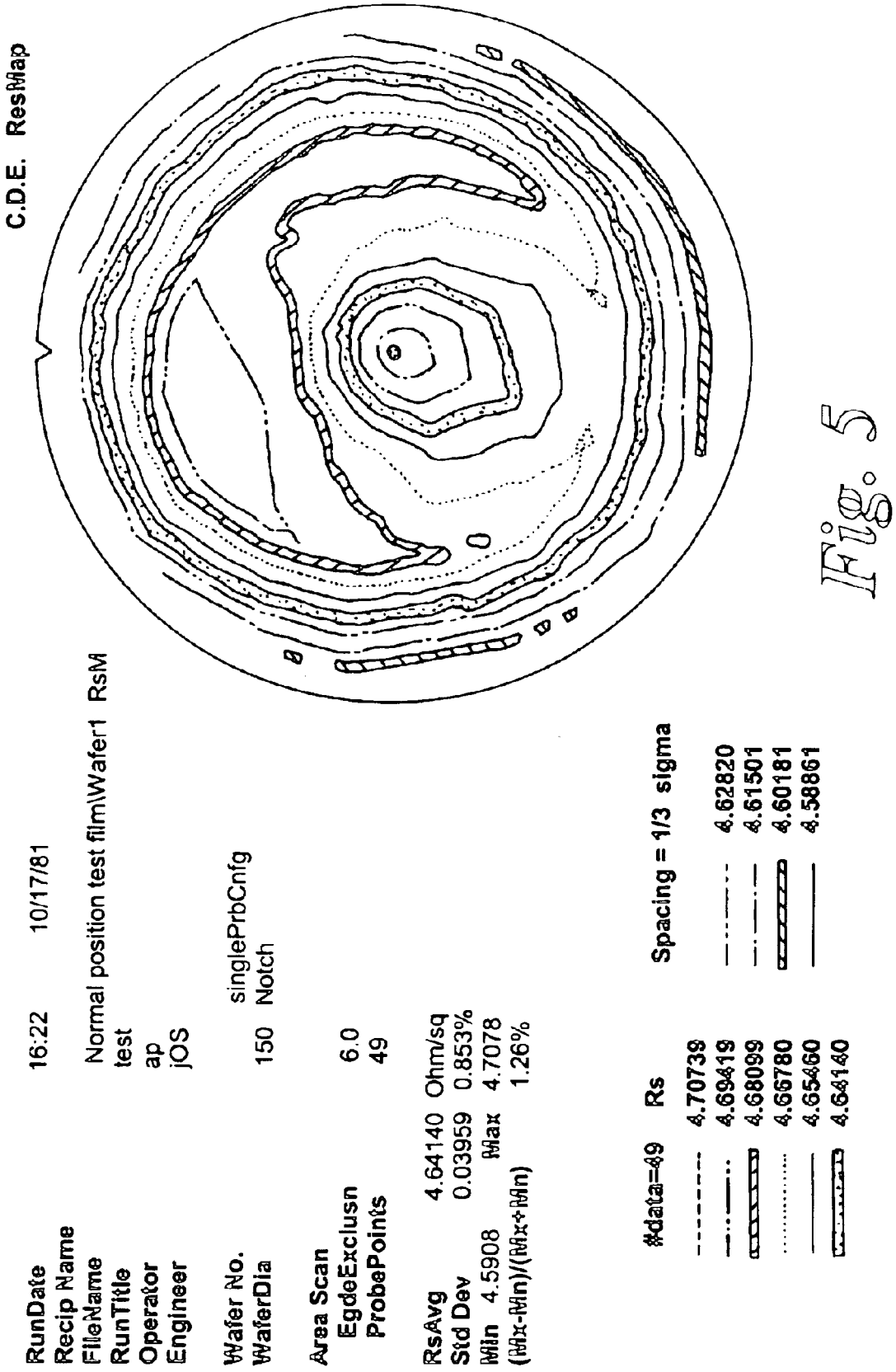
FIG. 5 is a resistivity map for a wafer process with no rotation and no axial offset.

As has been mentioned above, FIG. 2 shows a resistivity profile map of the offset but 0° rotation situation. FIG. 3 illustrates the position with a single 180° rotation and two deposition steps, whilst FIG. 4 is the map for 18 mm offset for four depositions with three rotations. FIG. 5 illustrates the position with a non-rotated not offset wafer.

Thus it can be seen, surprisingly, that uniformity can be significantly improved e.g. from 0.85% to 0.28% by introducing a non-uniformity in the deposition and then depositing on the wafer in at least two positions which are rotated with respect to each other.

There are several processes that require extremely good uniformity of deposition or processing and typically these are where characteristics other than purely electrical characteristics are required. For example in the production of acoustic or optical filters, where, in both cases, quality and yield of devices from a wafer require extremely high levels of uniformity across the surface of the substrate.

As has already been indicated it is particularly preferred that apparatus constructed to perform the method, as described in relation to FIGS. 1 and 6, is utilised, but the method can be carried out, but less efficiently, either by placing the wafer sequentially into separate deposition stations with varying offsets and part rotations or removing the offset wafer, part rotating and replacing the wafer in the original deposition chamber.

Finally it should be understood that the experiment took place in a system already optimised for best uniformity for a static wafer placed on axis with respect to the process and material source. In chambers where the process chamber contains significant non-uniformity, then that non-uniformity may be overcome, to a great extent, by wafer part rotations whilst the wafer is not notionally offset from the source of process material. However, for the purposes of this specification it is to be understood that such a non-uniformity means that effectively the deposition apparatus is arranged for deposition about an offset axis, which is determined by the degree of non-uniformity within the chamber.

This is frequently the case for etching or other chemical processes where minor differences in temperature, pressure, plasma or reactive species may result from the placement of pumping ports, wafer transport doors, RF connections etc.

We claim:

1. A method for processing a thin film on a substrate at a substrate location, the method including:
   locating the substrate in a first rotational position at the substrate location, the substrate location being opposed to a process station having a first axis that passes through the substrate location, the process station being arranged for processing the substrate during rotation about the first axis, the substrate location being symmetrical about a second axis parallel to but offset from the first axis and the substrate being rotated about an axis generally orthogonal to and passing through the substrate location to a second rotational position after an initial process and further processing takes place when the substrate is in the second rotational position.

2. A method as claimed in claim 1 where the axis of rotation is the second axis.

3. A method as claimed in claim 1 wherein the substrate is rotated more than once and there are a plurality of deposition stages.

4. A method as claimed in claim 1 wherein the process is continuous and the further processing or plurality of process stages are defined by the rotation of the substrate.

5. A method as claimed in claim 1 wherein the offset between the first and second axes is greater than zero and less than half the width of the substrate.

6. A method as claimed in claim 1, wherein the second rotational position is between 90° and 270° from the first rotational position.

7. A method as claimed in claim 1 wherein the 1 sigma conformity is less than 0.5%.

8. A method as claimed in claim 1 wherein the process is physical or chemical vapour deposition or etching.

9. A method as claimed in claim 1 wherein the process is sputtering and the process station includes a target and a magnetron rotatable relative to the target about the first axis.

10. A method as claimed in claim 1 wherein the process is sputtering and the process station includes a target, a magnetron rotatable relative to the target about the first axis and wherein the target has an axis of symmetry which is coincident with or offset from the first axis.

11. Process apparatus for processing a substrate at a substrate location, the apparatus including a process station for processing a substrate rotated about a first axis that passes through the substrate location and process station, and a substrate support for supporting a substrate about a second axis that passes through the substrate location wherein the first and second axes are offset and the apparatus further includes a substrate turntable device for rotating the substrate to a position which is rotated by less than 360° from its starting position.

12. Apparatus as claimed in claim 11 including a controller for operating the apparatus in the sequence:
    (1) process the substrate to part of the intended depth;
    (2) rotate the substrate to the position; and
    (3) process some or all of the remaining intended depth.

13. Apparatus as claimed in claim 12 including a controller for operating the apparatus in the sequence:
    (4) process the substrate to part of the intended depth;
    (5) rotate the substrate to the position; and
    (6) process some or all of the remaining intended depth,
    wherein the controller controls step (3) to process some of the intended depth and steps (2) and (3) are repeated.

14. Apparatus as claimed in claim 11 wherein the turntable device comprises a boss centrally located in the support and raisable from the support for rotation.

15. Apparatus as claimed in claim 11 wherein the turntable device is driven by at least one magnetically coupled actuator.

16. Apparatus as claimed in claim 11 wherein the process station includes a sputter target and magnetron rotatable about the first axis.

17. A method of treating a single substrate including placing the substrate in a substrate location opposed to a process station of an apparatus for processing the substrate, the process station being arranged for processing the substrate during rotation about a first axis that passes through the substrate location, wherein the processing at the substrate is non uniform wherein the substrate is rotated during processing or between processing steps to enhance conformity of process about an axis or axes generally orthogonal through the substrate location that axis or axes being located not at the substrate's center but within the substrate's edges.

18. A method as claimed in claim 17 wherein the process is etching, physical vapour deposition or chemical vapour deposition.

19. A method of processing a thin film on a substrate at a substrate location, the method comprising:
    locating the substrate at a first rotational position about a first axis that passes through the substrate location;

processing the substrate using a process station opposed to the substrate processing location, the process station being arranged for processing the substrate during rotation about a second axis that passes through the substrate location, the second axis being parallel to but offset from the first axis, where the substrate remains at the first rotational position during the processing;

rotating the substrate about the first axis to a second rotational position; and, further processing the substrate using the process station, the substrate remaining at the second rotational position during the further processing.

* * * * *